(12) United States Patent
Boden, Jr.

(10) Patent No.: US 6,798,016 B2
(45) Date of Patent: Sep. 28, 2004

(54) TRENCH MOS DEVICE AND PROCESS FOR RADHARD DEVICE

(75) Inventor: Milton J. Boden, Jr., Redondo Beach, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 09/844,958

(22) Filed: Apr. 27, 2001

(65) Prior Publication Data

US 2001/0015457 A1 Aug. 23, 2001

Related U.S. Application Data

(62) Division of application No. 08/818,908, filed on Mar. 17, 1997, now Pat. No. 6,236,099.
(60) Provisional application No. 60/015,901, filed on Apr. 22, 1996.

(51) Int. Cl.[7] .................. H01L 29/76; H01L 29/94; H01L 31/062; H01L 31/113; H01L 31/119
(52) U.S. Cl. .................. 257/327; 257/328; 257/329; 257/330; 257/331
(58) Field of Search .................. 257/327–331, 257/341, 495

(56) References Cited

U.S. PATENT DOCUMENTS

| | | | | |
|---|---|---|---|---|
| 5,079,602 A | * | 1/1992 | Harada | 257/139 |
| 5,298,442 A | * | 3/1994 | Bulucea et al. | 148/DIG. 126 |
| 5,298,781 A | * | 3/1994 | Cogan et al. | 257/333 |
| 5,917,216 A | * | 6/1999 | Floyd et al. | 257/329 |
| 6,236,099 B1 | * | 5/2001 | Boden, Jr. | 257/495 |

* cited by examiner

*Primary Examiner*—Thien F Tran
(74) *Attorney, Agent, or Firm*—Ostrolenk, Faber, Gerb & Soffen, LLP

(57) ABSTRACT

A MOSgated device is resistant to both high radiation and SEE environments. The active area of the device is formed of trench devices having a thin gate dielectric on the trench walls and a thicker dielectric on the trench bottoms over the device depletion region. Termination rings formed of ring-shaped trenches containing floating polysilicon plugs surrounds and terminates the device active area.

18 Claims, 5 Drawing Sheets

(MASK1)

(MASK2)

(MASK3)

(MASK 4)

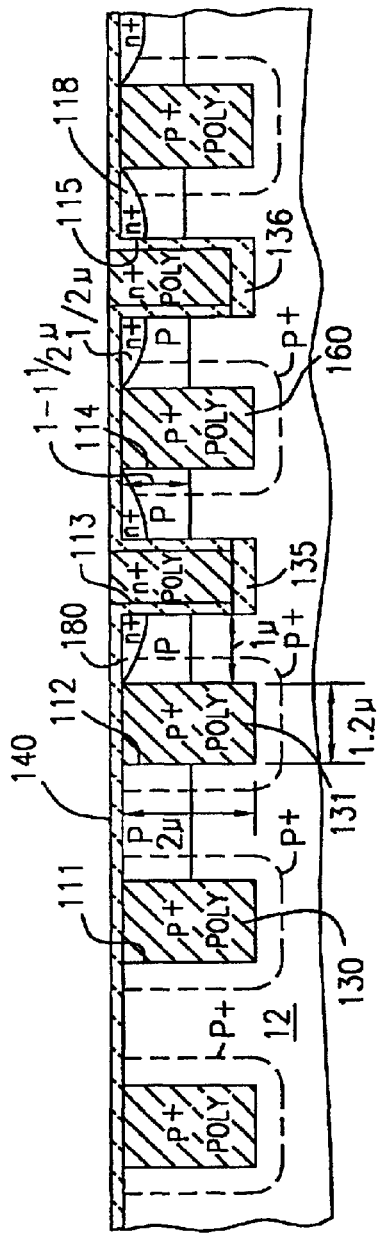
FIG. 7 (MASK 5)
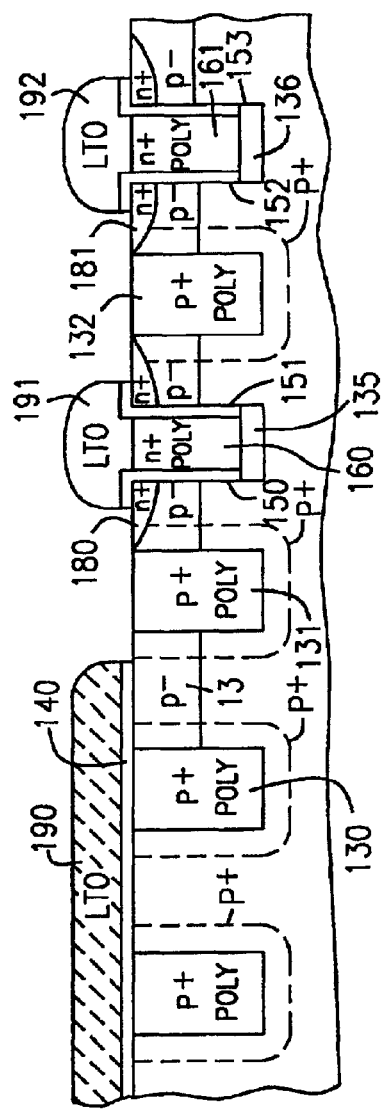
FIG. 8 (MASK 6)

TRENCH MOS DEVICE AND PROCESS FOR RADHARD DEVICE

RELATED APPLICATIONS

This application claims the priority of Provisional Application Ser. No. 60/015,901, filed Apr. 22, 1996. This application is a division of Ser. No. 08/818,908 filed Mar. 17, 1997, allowed now U.S. Pat. No. 6,236,099.

FIELD OF THE INVENTION

This invention relates to radiation hardened ("radhard") devices which have improved resistance to damage by large (megarad) doses of ionizing radiation, or by single or plural high energy charged particles ("SEE" particles).

BACKGROUND OF THE INVENTION

Radiation hardened power MOSFETs and other MOS-gated devices for use in space or other high radiation ambients have conflicting design requirements for resisting damage due to high doses of ionizing radiation on the one hand, and damage due to even single event high energy charged particles ("SEE") on the other hand. Thus, a thin gate oxide is desirable to resist high radiation (megarad) environments, while a relatively thick gate oxide is desirable to resist SEE effects.

More specifically, it is known that after exposure to a large total dose of ionizing radiation a positive charge will build up in the gate oxide to change the device threshold voltage. Further, there is an increase of interface traps at the silicon/gate oxide boundary. Both of these effects are reduced by using a thinner gate oxide, for example, one having a thickness of less than about 900 Å.

Devices in a high radiation environment, for example, outer space, are also subject to damage or failure if struck by even a single high energy charged particle. Such charged particles which pass into or through the silicon generate a large number of electron-hole pairs in the depletion region of the device. Some of these charges collect on the gate oxide, resulting in a high potential across the gate oxide. Thus, a thicker gate oxide, for example, one thicker than about 1300 Å is desired to resist SEE failure.

Because of these diverse requirements, different manufacturing processes are used for a "megarad" product, designed for use in a high total radiation dose environment, and an SEE product which is optimized for single particle effects.

In presently designed vertical conduction, multi-cellular MOSFET products, the charge collection at the oxide interface is in the drift region between cells. The device voltage is set in the charge in the inversion region. Thus, a design trade-off is necessary to set the gate oxide thickness for either a thin gate oxide for good total dose resistance or relatively thicker gate oxide for good SEE resistance.

BRIEF DESCRIPTION OF THE INVENTION

In accordance with the present invention a MOSgated device (a power MOSFET, IGBT, GTO or other device employing a MOS gate) which has optimal oxide thicknesses for both total radiation dose resistance and SEE resistance is provided, using a trench design device. Thus, a known vertical conduction trench device has an invertible channel region on the sides of each trench, while the drift region lies along and under the bottoms of the trenches. Consequently, the gate oxide thickness at the walls of each trench can be relatively thin, and less than about 900 Å (preferably about 500 Å) for optimal total dose resistance, while the bottoms of the trenches have a relatively thick oxide liner, for example, greater than about 1300 Å (and preferably about 3000 Å) for optimal resistance to breakdown by single event effects.

BRIEF DESCRIPTION OF THE DRAWINGS

FIGS. 2 through 8 show a cross-section of the device of FIG. 2 as it is manufactured and following various mask steps.

DETAILED DESCRIPTION OF THE DRAWING

Figure 1:
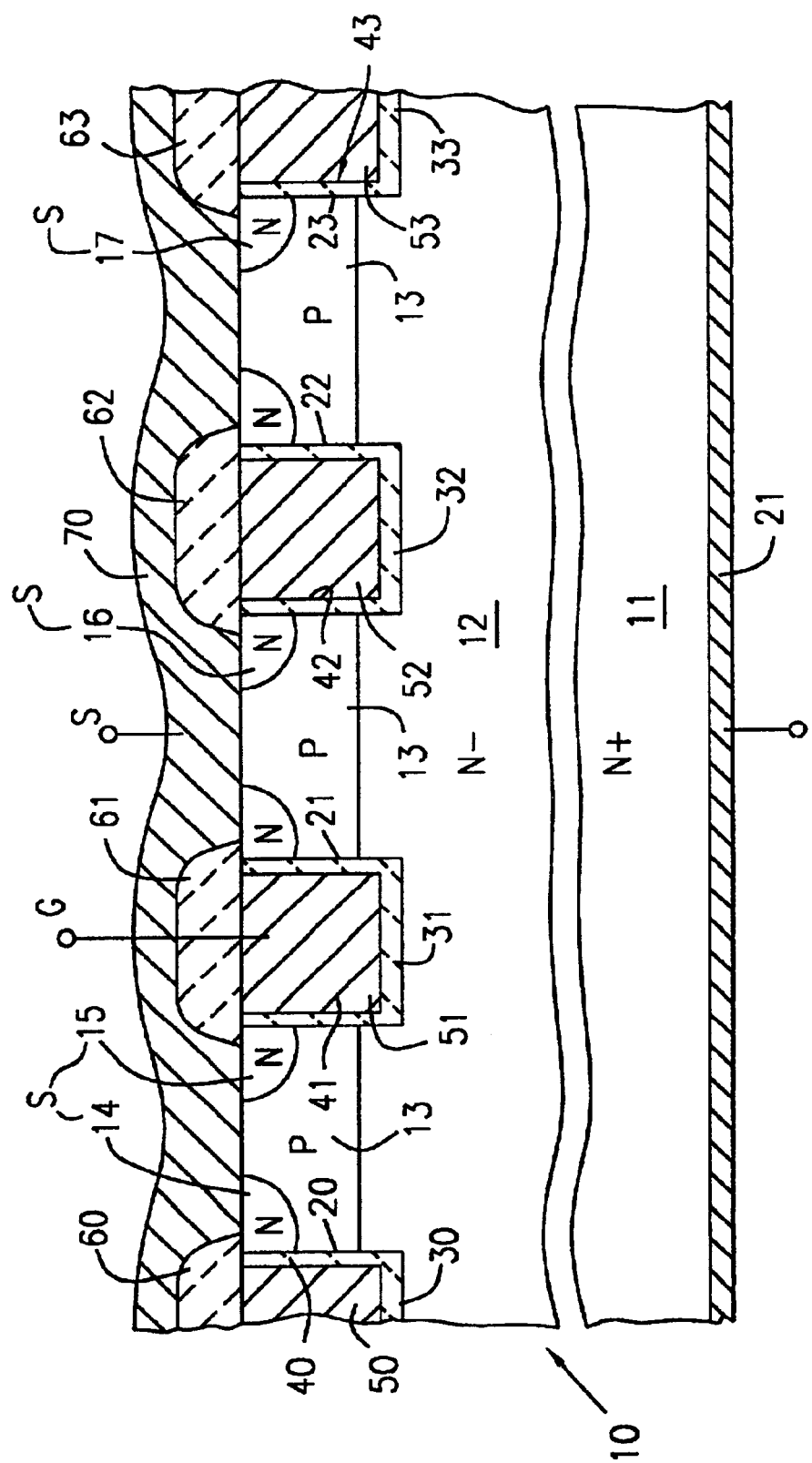
FIG. 1 is a cross-section of an otherwise conventional trench type power MOSFET with diverse thickness oxides in the wells to optimize total radiative dose resistance and SEE resistance in accordance with the invention.

Referring first to FIG. 1, there is shown a cross-section of a small portion of a multicell trench process vertical conduction power MOSFET device which contains the features of the present invention. More specifically, a monocrystalline silicon chip 10 consists of an N+ support body 11 which has an N(−) epitaxially formed layer 12 thereon. A P type channel region 13 is diffused into the surface of region 13 to a depth of about 1 to about 1.5 microns, followed by the diffusion of spaced N+ source regions 14 to 19. A plurality of parallel elongated wells or trenches 20, 21, 22 and 23 are then etched into the upper surface of layer 12 to a depth, for example, of about 2 microns. Wells 20 to 23 may also be formed as separate symmetric cells distributed over the surface of region 12. The wells have a width of about $1.5\mu$ and a separation of about 1 $\mu$.

Thick oxide layers 30 to 33 are grown or deposited on the bottoms of wells 20 to 23 respectively.

In order to grow a thick oxide at the bottom of the trench, it may be first implanted to damage the bottom surface and to enhance the oxide growth rate at the bottom. The oxide can also be deposited by a method having good step coverage, such as low pressure chemical vapor deposition. As another process, after depositing oxide in the wells, the oxide may be etched to reduce the thickness of layers, preferably to less than about 3000 Å and to expose the side walls of grooves 20 to 23. Thereafter, gate oxide layers 40 to 43 are grown on the side walls of grooves 20 to 23 to a thickness of about 500 Å.

Thereafter, the wells 20 to 23 are filled with conductive N+ polysilicon layers 50 to 53 which act as the conductive gates for the device and which are laterally interconnected (not shown) and have an appropriate common gate connection terminal G. The tops of polysilicon layers 50 to 53 are covered by patterned oxide insulation layers 60 to 63 respectively. The upper surface of the device then receives an aluminum source electrode 70 which is connected to the exposed regions of source regions 14 to 17, and to the P regions 13 between the sources. A drain electrode 71 is formed on the bottom of chip 10.

Numerous manufacturing processes can be used to make the device of FIG. 1. The essential result is that the oxide layers 30 to 33 are relatively thick, for example, greater than 1300 Å, and are optimized for SEE resistance, while the gate oxide thickness on the walls of the trenches is thinner than the bottom oxide layers and is optimized for best radiation dose resistance and is less than about 900 Å.

Figure 1A:
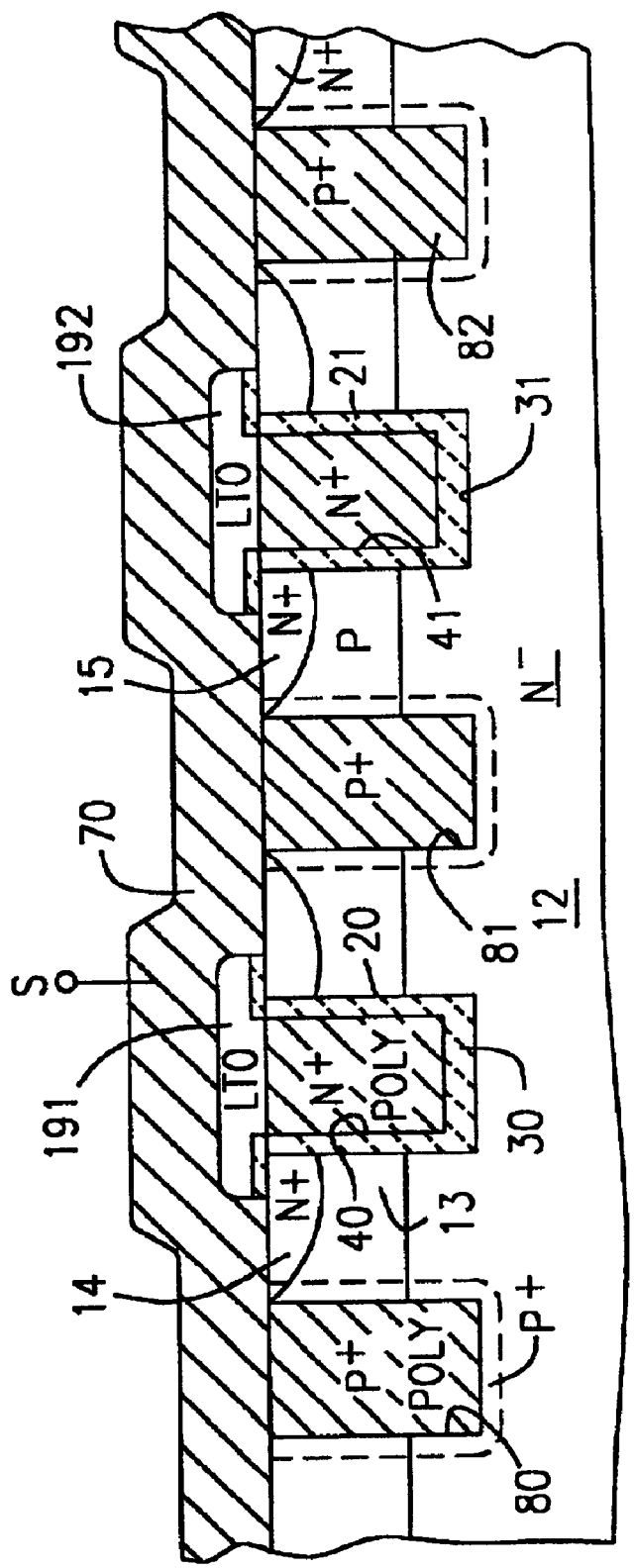
FIG. 1A shows another and preferred embodiment of the invention in which a p+ conductive trench is added between spaced trenches containing the invertible sidewall channels.

Referring next to FIG. 1A, a second preferred embodiment of the invention is shown, in which elements similar to those of FIG. 1 have the same identification numeral. In FIG. 1, however, added trenches 80 to 82 are formed between pairs of trenches 20, 21, 22 and 23. For example, trench 81 is between trenches 20 and 21 and trench 82 is between trench 21 and trench 22 (not shown in FIG. 1A). Trenches 80, 81 and 82 are filled with conductive P+ polysilicon, and make good contact to source contact 70. The P+ polysilicon diffuses into the trench walls, as shown in dotted lines in FIG. 1A. A plurality of spaced grooves like groove 80 form the device termination as later shown in FIG. 8.

Trenches containing MOS gated structure 20, 21 may be polygonal in topology and may be symmetrically spaced and disposed over the surface of the chip 10. Source regions 14, 15 surround trenches 20, 21, respectively, containing MOS gated structure. Intermediate trenches 80–82 may consist of a trench of lattice shape in topology extending in the space defined between spaced polygonal trenches 20, 21.

Figure 2:
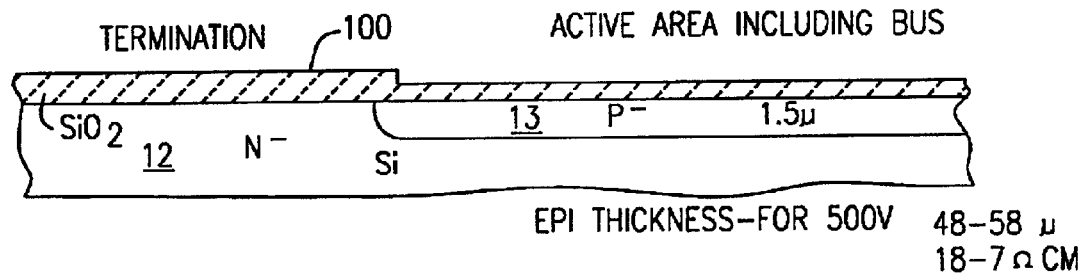

FIGS. 2 through 8 show the preferred manufacturing process and show the device being processed at different successive stages of manufacture. Thus, FIG. 2 shows a small portion of the chip or wafer being processed after the first mask. An N(−) epitaxial region 12 is provided. For a 500 volt part epi 12 has a thickness of 48 to 58 microns and a resistivity of 18.2 ohm cm. Region 12 is deposited on an underlying N(+) substrate, not shown in FIG. 2. An oxide 100 having a thickness of about 5000 Å has been grown on the device termination region in FIG. 2, while the active area has received a boron implant at 80 KEV and about 6.0E 13, driven to a depth of about 1.5 microns to form P(−) region 13.

The device topology may employ elongated parallel wells. However, the topology in FIGS. 2 to 8 is for a cellular device, and the wells 113 to 116 are formed as part of a symmetrical grid of polygonal wells. Rings 111 and 112 are continuous rings which surround the active area.

Figure 3:
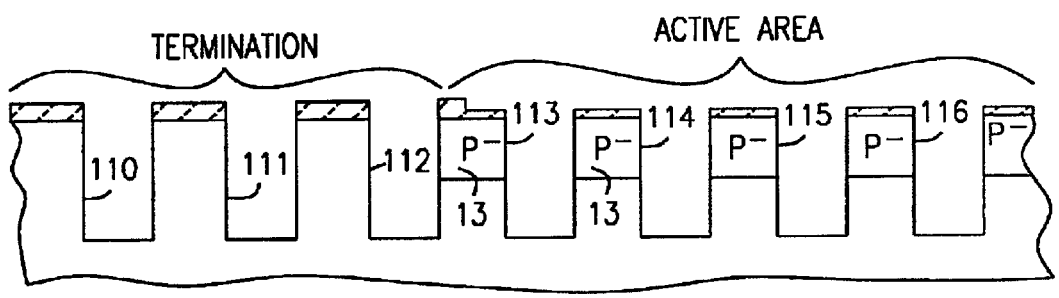

FIG. 3 shows the structure of FIG. 2 after mask 2 in which a plurality of wells, including termination wells 110 to 112 (20 termination rings may be used for a 600 volt device) and active area wells 113 to 116 are etched to a depth of about 2 microns with a spacing of about 1 micron and a width of about 1 to 1½ microns.

Figure 4:
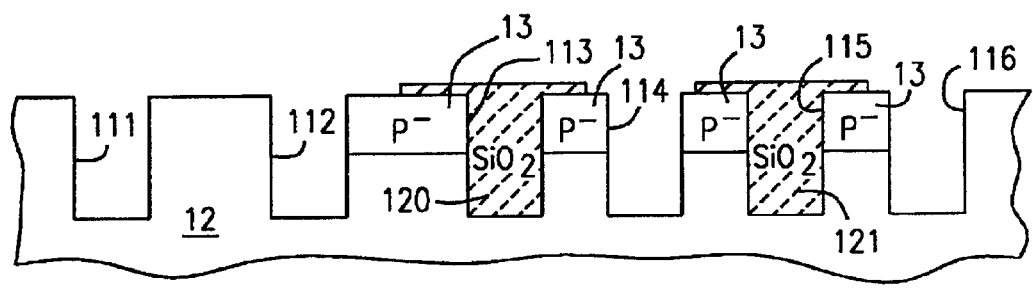

FIG. 4 shows the structure of FIG. 3 after mask 3, in which an oxide layer is grown and etched to form silicon dioxide plugs 120 and 121 in alternate active area wells 113 and 115.

Figure 5:
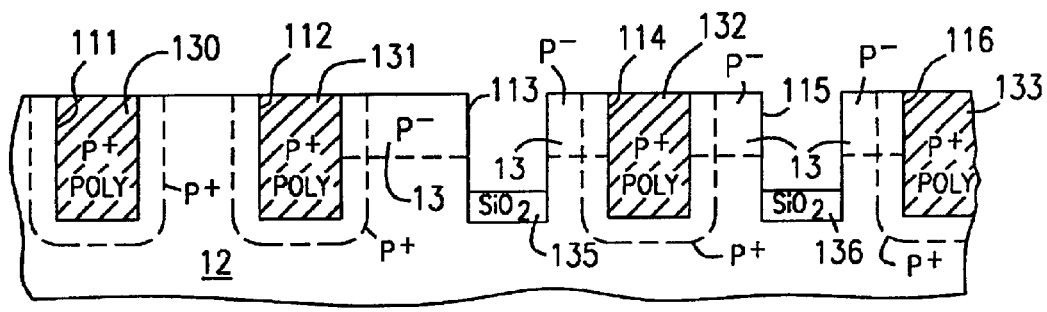

Thereafter and as shown in FIG. 5, a polysilicon layer is deposited to fill the termination trenches 130 and 131 and the alternate trenches in the active area 132 and 133, and to cover the surface. A boron implant of 1E16 at 80 KeV is applied to the surface of this polysilicon. A high temperature diffusion is used to distribute this boron throughout the polysilicon and into the silicon to the dotted line. The rapid diffusion of boron in polysilicon as compared to single crystal silicon results in the p-n junction formed by this boron diffusion being deeper than it is wide. The polysilicon surface is etched to the upper surface of layer 12 to leave only plugs 130 to 133 in place. Thereafter, the oxide plugs 120, 121 and other oxides on the device surface are etched until the oxide plugs 120 and 121 have been etched down to about 3000 Å to define thick oxide bottom layers 135 and 136 in alternate wells 113 and 115 respectively.

Figure 6:
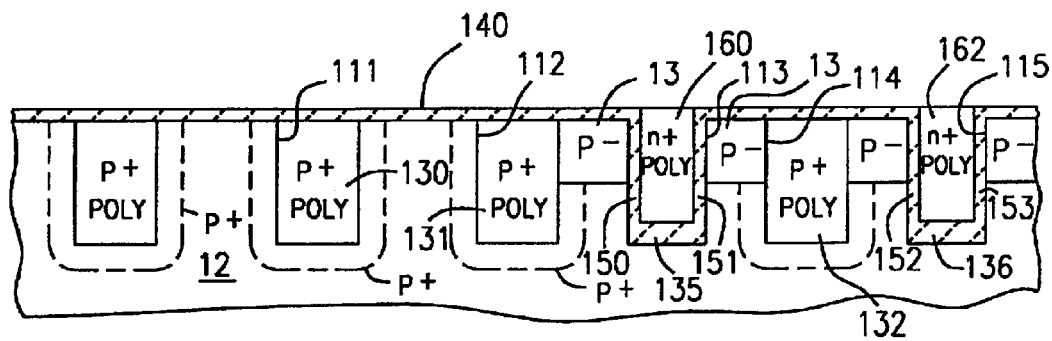

Thereafter and as shown in FIG. 6 a thin gate oxide, 140 for example, 500 Å is grown over all exposed silicon, including the interior walls of grooves 113 and 115. These correspond to thin gate oxide layer portions 150, 151, 152, and 153 in FIG. 6.

Thereafter, a polysilicon deposition is applied which fills the trenches and covers the surface of the die. A suitable mask 4 is applied which defines the gate busses (not shown). The polysilicon is etched to the surface of the chip except in the gate bus areas, leaving polysilicon plugs in trenches 160 and 162.

As next shown in FIG. 7, the surface of the wafer is masked with mask 5 and N+ source regions 180 and 181 of ring-shaped topology and the polysilicon plugs 160 and 161 are implanted with phosphorus at a dose of 5E15 and an energy of 80 KEV. The sources 180 and 181 may have a depth of about ½ micron.

Sources 180 and 181 are shown in FIG. 7 for a hexagonal topology, although they could be in strip form. A polygonal topology is preferred for low voltage devices and a line topology is preferred to higher voltage ratings.

FIG. 8 shows the structure of FIG. 7 following the 6th mask step. Thus, the surface of the wafer first has an interlayer 190 of low temperature oxide ("LTO") formed thereon. A mask step then allows the etching of the LTO 190 and underlying gate oxide 140 to define the pattern shown in FIG. 8, with LTO 190 covering the P+ poly termination rings including ring 130, and LTO buttons 191 and 192 covering the N+ poly plugs 160 and 161, but exposing the P+ poly plugs 131, and 132 and their surrounding source rings 180 and 182.

Source metallizing can then be applied to the device surface, as shown in FIG. 1A.

It will be noted that in the final device, that the P+ diffusions in poly plugs 131 and 132 are self aligned to the N+. Therefore, the P+ can be very close to the channel without invading the channel.

The termination rings 110 and 111 and other similar concentric spaced rings which extend to the edge of the die (not shown) are needed to control the very high electric field at the corner of the innermost trenches of the active region, such as trench 112 in FIG. 8. That is the electric field at the corner of the P+ diffusion from the walls of trench 112 is very high and will cause device breakdown at a voltage lower than could be obtained with the silicon used. Other terminations could be used, for example, separate deep P diffusions.

In accordance with an important aspect of the invention, a novel floating ring termination structure is provided using poly filled trenches 110 and 111 with P+ doping, which are formed by the same process steps used to form the active region, and without requiring added mask steps.

The trenches may provide a plurality of floating rings, or at least one floating ring. The precise number of trenches used and their spacing can be optimized for each voltage rating. Thus, more rings with wider spacing are used for higher voltage devices and fewer rings at closer spacing are used for lower voltage ratings. For example, for a high voltage termination, the rings may be spaced by 3 to 5 microns. For a lower voltage termination, the rings could be spaced from 1.5 to about 2 microns. The wider spaced rings will break down at a lower voltage than closer spaced rings.

Significantly, when using poly filled trench rings, the breakdown voltage in any part of the device can be controlled by their spacing, to ensure that breakdown occurs first in the termination ring region and not in the active area of the device. Thus, by putting two rings sufficiently far, breakdown will first occur in the area of the two rings, permitting a turn off of the device before permanent damage can occur.

More particularly, in a power MOSFET, IGBT, or GTO device, it may be preferred to have breakdown first occur underneath the source bond pad (a portion of source 70 in FIG. 1A to the left of the drawing and removed from the active area) instead of at the active cell region. This minimizes the generation of minority carriers in the active area which can cause the turn on of parasitic bipolar devices which might latch on, resulting in device failure.

The appropriate spacing of the termination trenches relative to the device design can make the device more rugged in applications where avalanche voltage can occur.

In the above description of the invention, an N-channel device has been described. Obviously, the concentration regions can be reversed to produce a P-channel device.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A trench MOS gated device which has improved resistance to both high radiation and single event high energy charged particles (SEE), comprising:

a silicon wafer of one conductivity type having a plurality of spaced shallow active trenches containing respective gate structures and a plurality of intermediate trenches each disposed between a respective pair of active trenches;

each of said active trenches and each of said intermediate trenches having at least partly vertical walls joined at their bottoms by respective trench bottoms;

each of said active trenches containing a gate structure having a gate dielectric on at least portions of its said vertical walls, a bottom dielectric on the bottom and a conductive polysilicon plug of said one conductivity type which acts as a gate electrode and which contacts at least the interior surface of said gate dielectric;

each of said intermediate trenches having a shallow diffusion of a conductivity type opposite to said one conductivity type extending from its walls and bottom and being filled with a conductive polysilicon plug of said opposite conductivity type;

the spaces between said active and intermediate trenches each containing a channel region of said opposite conductivity type and an upper source region comprising a diffusion in contact with said respective polysilicon plugs in said corresponding intermediate trenches;

a common source contact contacting each of said source regions and each of said conductive plugs in each of said intermediate trenches; and a common gate electrode connected to each of said conductive plugs in each of said active trenches containing a gate structure and a drain contact connected to a drift region beneath said active and intermediate trenches;

wherein the thickness of said gate dielectric is chosen to optimize resistance to high radiation effects and wherein the thickness of said bottom dielectric is chosen to optimize resistance to SEE; and wherein said trench MOS gated device is supported in a die which further contains a termination structure; said plurality of active trenches and said plurality of intermediate trenches defining an active area; said termination structure comprising a plurality of concentric ring-shaped trenches surrounding said active area and extending radially from said active area toward the edge of said die; each of said plurality of ring-shaped trenches having a diffusion extending from its walls and bottom which is of said opposite conductivity type; each of said plurality of ring-shaped trenches having a conductive polysilicon plug of said opposite conductivity type; said plurality of ring-shaped trenches being out of direct contact with said source contact and comprising floating rings.

2. A trench MOS gated device which has improved resistance to both high radiation and single event high energy charged particles (SEE), comprising:

a silicon wafer of one conductivity type having a plurality of spaced shallow active trenches containing respective gate structures and a plurality of intermediate trenches each disposed between a respective pair of active trenches;

each of said active trenches and each of said intermediate trenches having at least partly vertical walls joined at their bottoms by respective trench bottoms;

each of said active trenches containing a gate structure having a gate dielectric on at least portions of its said vertical walls, a bottom dielectric on the bottom and a conductive polysilicon plug of said one conductivity type which acts as a gate electrode and which contacts at least the interior surface of said gate dielectric;

each of said intermediate trenches having a shallow diffusion of a conductivity type opposite to said one conductivity type extending from its walls and bottom and being filled with a conductive polysilicon plug of said opposite conductivity type;

the spaces between said active and intermediate trenches each containing a channel region of said opposite conductivity type and an upper source region comprising a diffusion in contact with said respective polysilicon plugs in said corresponding intermediate trenches; and a common source contact contacting each of said source regions and each of said conductive plugs in each of said intermediate trenches; and a common gate electrode connected to each of said conductive plugs in each of said active trenches containing a gate structure and a drain contact connected to a drift region beneath said active and intermediate trenches;

wherein the thickness of said gate dielectric is chosen to optimize resistance to high radiation effects and wherein the thickness of said bottom dielectric is chosen to optimize resistance to SEE; and wherein said trench MOS gated device is supported in a die which further contains a termination structure; said plurality of active trenches and said plurality of intermediate trenches defining an active area; said termination structure comprising at least a ring-shaped trench surrounding said active area and extending from said active area toward the edge of said die; said ring-shaped trench having a diffusion extending from its walls and bottom which is of said opposite conductivity type; said ring-shaped trench having a conductive polysilicon plug of said opposite conductivity type; said ring-shaped trench being out of direct contact with said source contact and comprising a floating ring.

3. A trench MOS gated device which has improved resistance to both high radiation and single event high energy charged particles (SEE), comprising:

a silicon wafer of one conductivity type having a plurality of spaced shallow active trenches containing respective gate structures and a plurality of intermediate trenches each disposed between a respective pair of active trenches;

each of said active trenches and each of said intermediate trenches having at least partly vertical walls joined at their bottoms by respective trench bottoms;

each of said active trenches containing a gate structure having a gate dielectric on at least portions of its said, vertical walls, a bottom dielectric on the bottom and a conductive polysilicon plug of said one conductivity type which acts as a gate electrode and which contacts at least the interior surface of said gate dielectric;

each of said intermediate trenches having a shallow diffusion of a conductivity type opposite to said one conductivity type extending from its walls and bottom and being filled with a conductive polysilicon plug of said opposite conductivity type;

the spaces between said active and intermediate trenches each containing a channel region of said opposite conductivity type and an upper source region comprising a diffusion in contact with said respective polysilicon plugs in said corresponding intermediate trenches; and a common source contact contacting each of said source regions and each of said conductive plugs in each of said intermediate trenches;

a common gate electrode connected to each of said conductive plugs in each of said active trenches containing a gate structure and a drain contact connected to a drift region beneath said active and intermediate trenches; and wherein said trench MOS gated device is supported in a die which further contains a termination structure; said plurality of active trenches and said plurality of intermediate trenches defining an active area; said termination structure comprising at least a ring-shaped trench surrounding said active area and extending from said active area toward the edge of said die; said ring-shaped trench having a diffusion extending from its walls and bottom which is of said opposite conductivity type; said ring-shaped trench having a conductive polysilicon plug of said opposite conductivity type; said ring-shaped trench being out of direct contact with said source contact and comprising a floating ring.

4. A trench MOS gated device which has improved resistance to both high radiation and single event high energy charged particles (SEE), comprising:

a silicon wafer of one conductivity type having a plurality of spaced shallow active trenches containing respective gate structures and a plurality of intermediate trenches each disposed between a respective pair of active trenches;

each of said active trenches and each of said intermediate trenches having at least partly vertical walls joined at their bottoms by respective trench bottoms;

each of said active trenches containing a gate structure having a gate dielectric on at least portions of its said vertical walls, a bottom dielectric on the bottom and a conductive polysilicon plug of said one conductivity type which acts as a gate electrode and which contacts at least the interior surface of said gate dielectric;

each of said intermediate trenches having a shallow diffusion of a conductivity type opposite to said one conductivity type extending from its walls and bottom and being filled with a conductive polysilicon plug of said opposite conductivity type;

the spaces between said active and intermediate trenches each containing a channel region of said opposite conductivity type and an upper source region comprising a diffusion in contact with said respective polysilicon plugs in said corresponding intermediate trenches;

a common source contact contacting each of said source regions and each of said conductive plugs in each of said intermediate trenches; and a common gate electrode connected to each of said conductive plugs in each of said active trenches containing a gate structure and a drain contact connected to a drift region beneath said active and intermediate trenches;

wherein said trench MOS gated device is supported in a die which further contains a termination structure; said plurality of active trenches containing a gate structure and said plurality of intermediate trenches defining an active area; said termination structure comprising a plurality of concentric ring-shaped trenches surrounding said active area and extending radially from said active area toward the edge of said die; each of said plurality of ring-shaped trenches having a diffusion extending from its walls and bottom which is of said opposite conductivity type; each of said plurality of ring-shaped trenches having a conductive polysilicon plug of said opposite conductivity type; said plurality of ring-shaped trenches being out of direct contact with said source contact and comprising floating rings.

5. The device of claim 4, wherein said concentric ring-shaped trenches have a predetermined spacing from one another.

6. The device of claim 5, wherein the spacing between said concentric ring-shaped trenches is selected such that breakdown caused by high reverse voltage occurs between said concentric ring-shaped trenches before breakdown occurs in said active area.

7. A MOS-gated semiconductor device comprising:

a semiconductor substrate of a first conductivity;

a drift region of said first conductivity formed over said substrate;

a channel region of second conductivity formed over said drift region;

a plurality of first trenches formed through at least said channel region;

gate insulation disposed on sidewalls of said plurality of first trenches;

a polysilicon gate electrode formed in each of said first trenches;

a second trench formed adjacent each said first trench, said second trench extending through said channel region and reaching at least said drift region;

a polysilicon body of said second conductivity formed in each said second trench;

a region of said second conductivity in said drift region adjacent each polysilicon body of said second conductivity;

conductive regions of said first conductivity formed adjacent each of said first trenches in said channel region; and an electrode in electrical contact with said conductive regions and said polysilicon bodies of said second conductivity.

8. A MOS-gated semiconductor device according to clam 7, wherein said polysilicon gate electrodes are of said first conductivity.

9. A MOS-gated semiconductor device according claim 7, wherein said conductive regions of said first conductivity are source regions and said electrode is a source contact.

10. A MOS-gated semiconductor device according to claim 7, further comprising a termination structure formed around said plurality of first trenches.

11. A MOS-gated semiconductor device according to claim 10, wherein said termination structure comprises a plurality of spaced trenches each forming a ring around said plurality of first trenches and each having a polysilicon body of said second conductivity disposed therein.

12. A MOS-gated semiconductor device according to claim 7, wherein said gate insulation is comprised of silicon dioxide characterized by being resistant to radiation damage due to total radiation dose.

13. A MOS-gated semiconductor device according to claim 12, wherein said gate insulation is less than 900 Å.

14. A MOS-gated semiconductor device according to claim 12, wherein said gate insulation is about 500 Å.

15. A MOS-gated semiconductor device according to claim 7, further comprising an insulation layer disposed at the bottom of each of said first trenches, said insulation at the bottom of each said first trench being thicker than said gate insulation on said sidewalls of said first trenches.

16. A MOS-gated semiconductor device according to claim 15, wherein said insulation at the bottom of each of said first trenches is comprised of silicon dioxide characterized by being resistant to SEE.

17. A MOS-gated semiconductor device according to claim 16, wherein said insulation at the bottom of each of said first trenches is thicker than 1300 Å.

18. A MOS-gated semiconductor device according to claim 16, wherein said insulation at the bottom of each of said first trenches is at least 3000 Å thick.

* * * * *